United States Patent [19]

Toyoshima et al.

[11] Patent Number: 5,448,198
[45] Date of Patent: Sep. 5, 1995

[54] SEMICONDUCTOR INTEGRATED CIRCUIT DEVICE HAVING CIRCUITRY FOR LIMITING FORWARD JUNCTION CURRENT FROM A TERMINAL

[75] Inventors: Yoshiaki Toyoshima, Matsudo; Yukio Wada, Yokohama; Hiroshi Takakura, Niigata, all of Japan

[73] Assignee: Kabushiki Kaisha Toshiba, Kanagawa, Japan

[21] Appl. No.: 40,419

[22] Filed: Mar. 31, 1993

[30] Foreign Application Priority Data

Mar. 31, 1992 [JP] Japan .................................. 4-105957
Dec. 14, 1992 [JP] Japan .................................. 4-353625

[51] Int. Cl.⁶ .................. H03K 19/0175; H03K 17/08
[52] U.S. Cl. .............................. 327/530; 327/534; 326/81; 326/72
[58] Field of Search ............... 307/296.1, 296.2, 296.8, 307/296.5, 296.443, 465, 475; 365/226, 229; 324/158; 326/81, 80, 62, 72; 327/543, 546, 545, 534, 547, 535

[56] References Cited

U.S. PATENT DOCUMENTS

| | | | |
|---|---|---|---|
| 3,942,047 | 3/1976 | Buchanan | 307/296.1 |
| 4,585,955 | 4/1986 | Uchida | 365/226 |
| 4,982,113 | 1/1991 | Jinbo | 307/296.2 |
| 5,065,091 | 11/1991 | Tobita | 324/158 |
| 5,153,853 | 10/1992 | Konishi | 365/229 |
| 5,157,291 | 10/1992 | Shimoda | 307/243 |
| 5,270,589 | 12/1993 | Sawada et al. | 307/425 |

Primary Examiner—Timothy P. Callahan
Assistant Examiner—Dinh Le
Attorney, Agent, or Firm—Spensley Horn Jubas & Lubitz

[57] ABSTRACT

A semiconductor integrated circuit device comprises a semiconductor substrate; an input and output terminal (1) formed on the semiconductor substrate; an input and output circuit (2, 3) formed on the semiconductor substrate, connected to the input and output terminal (1), and having an output buffer (2) of CMOS FETs, supply voltages Vcc1 and Vcc2 being applied to the output buffer; a semiconductor integrated circuit formed on the semiconductor substrate and connected to the input and output circuit; and a circuit for preventing forward junction current from flowing from the input and output terminal (1) to the output buffer (2) when an input voltage exceeding the supply voltages is applied to the output buffer. In an integrated circuit device using a plurality of different supply voltages, it is possible to prevent an input voltage beyond the supply voltages from being applied to the input and output circuit. A voltage switching circuit (4) responsive to signals A and B supplied to an output buffer (2) is interposed between the output buffer (2) and a pad (1). When a voltage higher than the supply voltages is applied to the output buffer (2) from the outside, the substrate potential is determined to a value equal to or higher than the external voltage. Further, the voltage applied from the outside can be also lowered than the supply voltages of the output buffer, before applied to the output buffer.

37 Claims, 9 Drawing Sheets

SEMICONDUCTOR INTEGRATED CIRCUIT DEVICE HAVING CIRCUITRY FOR LIMITING FORWARD JUNCTION CURRENT FROM A TERMINAL

FIELD OF THE INVENTION

The present invention relates to a semiconductor integrated circuit device provided with an input and output circuit of CMOS structure (Complementary Metal Oxide Semiconductor), and more specifically to a semiconductor integrated circuit device provided with an input and output circuit for facilitating an input and output interface function for a device operative on the basis of a different supply voltage.

BACKGROUND OF THE INVENTION

Recently, the semiconductor circuit devices such as ICs, LSIs, etc. have been developed markedly owing to the element microminiaturization technique represented by scaling technique. In the generation prior to 1 $\mu$m until now, the devices have been microminiaturized by scaling only the element dimensions with the supply voltage kept at a constant value (e.g., 5 V). In the recent submicron generation, however, it has become difficult to maintain the supply voltage at only 5 V. In other words, it has become impossible to disregard a decrease in the breakdown voltage due to a decrease in thickness of the gate oxide film or a decrease in hot carrier breakdown voltage due to a decrease in length of the gate. On the other hand, the current consumption increases more and more with increasing number of elements per chip and therefore the quantity of heat generated by a single chip increases, in spite of the fact that there exists a strong demand of lower power consumption in the case of a portable device, in particular. Therefore, the packaging technique has now approached a limit. As described above, a lower supply voltage is required more and more from the standpoints from both the element makers and users. In practice, however, it is still difficult to change the supply voltage from 5 V to 3 V, for instance. This is because all the ICs included in a system must be activated by 3 V and additionally there exist some ICs (e.g., analog ICs) not suitable for low voltage. Accordingly, a system in which 3 V and 5 V supply voltages are mixed has been inevitably required, prior to realization of a system activated by only the 3 V supply voltage. The present invention relates to an interface disposed between integrated circuits operative by different supply voltages, and provides a semiconductor integrated circuit device used with integrated circuits to which a lower supply voltage is required (e.g., microcomputer, memory device, general purpose logic circuit, ASICLSI, etc.).

Figure 14:
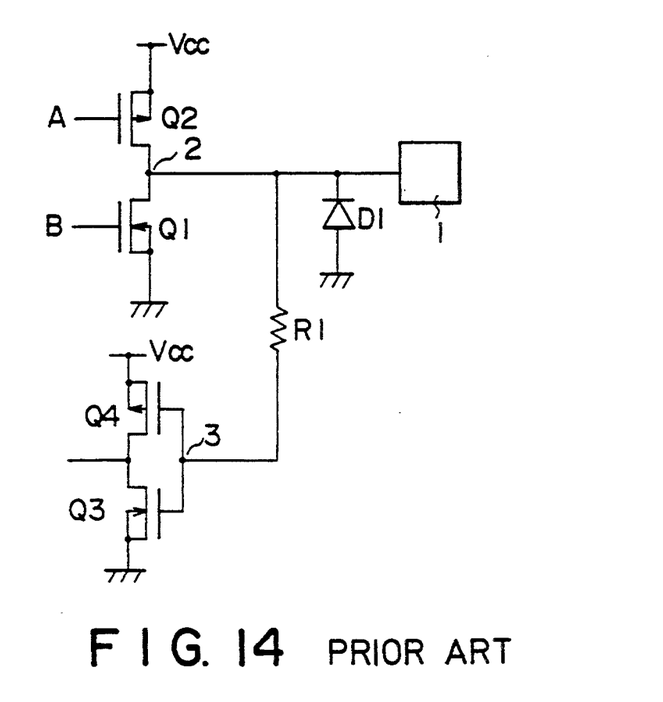
FIG. 14 is a circuit diagram showing an input and output circuit device of the conventional semiconductor integrated circuit device.

FIG. 14 shows an ordinary input and output circuit for a semiconductor integrated circuit device. In the case of the input and output circuit for an integrated circuit (LSI) of CMOS structure, the input and output circuit is generally composed of CMOS circuits in the same way as the internal circuit elements. The input and output circuit as shown in FIG. 14 is provided with an output buffer 2 and an input buffer 3 both connected to an input and output terminal 1. This input and output terminal 1 is referred to as a pad electrode on the semiconductor substrate. A number of pad electrodes are arranged on the periphery of the semiconductor substrate. Between the buffers 2, 3 and the input and output terminal 1, a protective circuit is connected to protect the circuit from an electrostatic discharge applied from the outside. This protective circuit is composed of a resistor R1 and a diode D1. The output buffer 2 is composed of an N channel MOS FET (referred to as NMOS transistor, hereinafter) Q1 and a P channel MOS FET (referred to as PMOS transistor, hereinafter) Q2. The input buffer 3 is composed of an NMOS transistor Q3 and a PMOS transistor Q4. A signal A is applied to the PMOS transistor Q2 of the output buffer 2 and a signal B is applied to the NMOS transistor Q1 of the output buffer 2. The input and output status of this input and output circuit can be listed in Table 1 as follows:

TABLE 1

| A | B | Q1 | Q2 | INPUT/OUTPUT STATUS |
|---|---|-----|-----|---------------------|
| L | L | OFF | ON | H OUTPUT |
| H | H | ON | OFF | L OUTPUT |
| H | L | OFF | OFF | HIGH IMP. INPUT |

Table 1 above indicates that the operation is composed of three input and output statuses. That is, when both the signals A and B are at a low ("L") level, the NMOS transistor Q1 is turned off and the PMOS transistor Q2 is turned on, so that the input and output status is at a high ("H") output status. When both signals are at a high ("H") level, Q1 is turned on and Q2 is turned off, so that the input and output status is a low ("L") output status. When the signal A is at a high ("H") level and the signal B is at a low ("L") level, both Q1 and Q2 are turned off, so that the input and output status is at a high ("H") impedance input status.

The input and output circuit of the CMOS circuit as described above is widely used for the semiconductor integrated circuits. However, it is not allowed to apply a voltage lower than the ground voltage 0 V or higher than the supply voltage Vcc. For instance, if a voltage higher than Vcc is applied, the PN junction formed at the drain of the PMOS transistor Q2 is biased in the forward direction, so that a large current flows from the input and output terminal 1 to the supply voltage Vcc. Therefore, the voltage applied to the input and output terminal 1 is standardized so as to be limited within a range higher than (ground voltage 0 V +0.5 V) and lower than (supply voltage Vcc +0.5 V).

With the advance of the microminiaturization and higher integration of the integrated circuit of CMOS structure, however, it has become difficult more and more to conform to the above-mentioned limit. In the case of the CMOS-LSI using MOS transistors each with a gate length of 0.5 $\mu$m or less, for instance, it has been proposed that the ordinary supply voltage of 5 V is to be lowered to about 3 V in order to prevent the element reliability from being deteriorated due to an increase in the electric field of the internal elements, as disclosed in JEDEC STANDARD 8-1, 1984. In addition, it is desirable to reduce the supply voltage; that is, to reduce the signal amplitude from the standpoints of reduction of noise generated whenever the input and output circuit of the integrated circuit is switched. However, since the CMOS circuits are usually connected to other CMOS-LSIs of various functions so as to construct a system, without being used independently as an integrated circuit, all the CMOS LSI are not necessarily operative on the basis of only a low supply voltage; that is, there exist cases where a plurality of integrated circuits activated by supply voltages of 3 V and 5 V are mixed with each other. Therefore, in the case where a high level voltage of 5 V is applied to the input and output circuit of the integrated circuit of the supply voltage 3 V, since the PN junction is biased in the forward direction as already explained and thereby the elements may be broken down, it is impossible to use the conventional input and output circuit as it is.

Figure 15:
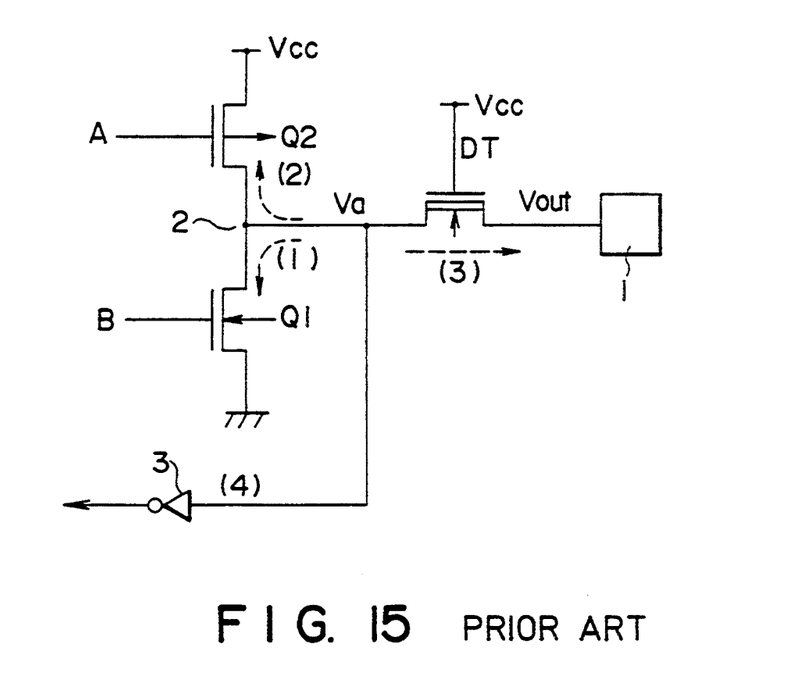
FIG. 15 is a circuit diagram showing another input and output circuit device of the conventional semiconductor integrated circuit device.

FIG. 15 is another conventional input and output circuit which is provided with an interface circuit between two circuits of different supply voltages, as disclosed in Japanese Patent Application No. 3-3827. This input and output circuit is provided for the lower supply voltage side integrated circuit of the integrated circuits of different supply voltages. In FIG. 15, a push-pull circuit 2 is composed of an NMOS transistor Q1 and a PMOS transistor Q2 of the ordinary output buffer circuit. Further, an NMOS transistor of depletion type (referred to as D transistor, hereinafter) having a gate connected to a supply voltage is connected between the push-pull circuit 2 and an input and output terminal (pad) 1. The depletion type transistor is a transistor which is normally turned on or whose threshold value (Vthd) is negative so as to constitute an interface circuit. In this conventional interface circuit, there exists a problem in that the threshold value Vthd of the D transistor has no margin, which is explained in further detail hereinbelow on the assumption that the supply voltage is 3.3 V ±0.3 V; and the inputted external signal amplitude is 5 V.

Figure 16:
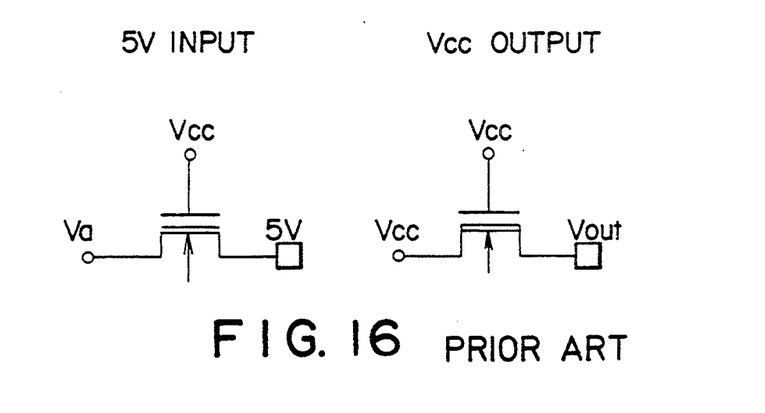
FIG. 16 is an illustration for assistance in explaining the bias status of the D transistor used in the conventional semiconductor integrated circuit device.

In FIG. 15, the D transistor effects two contradictory operations. One is not to transmit the externally applied 5V to the internal side as much as possible; that is, to suppress the internal Va as low as possible, when the supply voltage of 5 V is inputted. The other is to transmit the internal voltage Vcc to the external side as much as possible; that is, to secure the signal amplitude of Vout, when the supply voltage Vcc is outputted. In this case, the circuit elements are broken down if the input voltage Va is not suppressed lower than an oxide film breakdown voltage of about 3.6 V as shown by (1) and (4) in FIG. 15 and lower than a forward bias voltage of (Vcc+0.3 V) at the PN junction of the PMOS transistor as shown by (2) in FIG. 15. On the other hand, it is necessary to secure the output voltage Vout as shown by (3) in FIG. 15 at the voltage of Von=2.7 V of the TTL. FIG. 16 shows the bias status of the D transistor. In FIG. 16, when 5 V is inputted, 5 V is applied to the pad 1 of the source side and Vcc is applied to the gate thereof, so that Va is Vcc−Vthd (Vcc), where the second term is a threshold value Vthd of the D transistor to which a back gate voltage Vcc is applied. On the other hand, when Vcc is outputted, the voltages of the source and the drain are reversed and Vcc is applied to the source and the gate thereof, so that Vout is Vcc−Vthd (Vcc).

Figure 17:
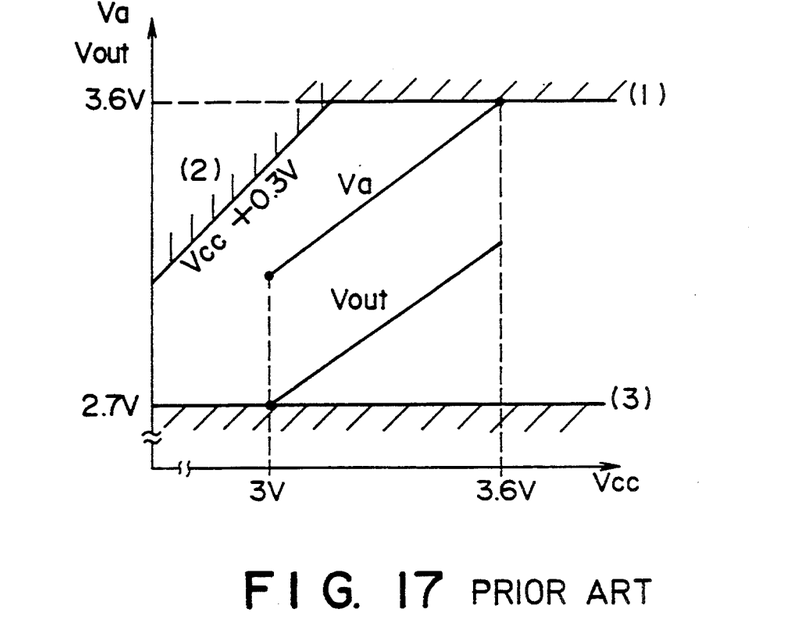
FIG. 17 is a margin map of the conventional input and output circuit.
Figure 18:
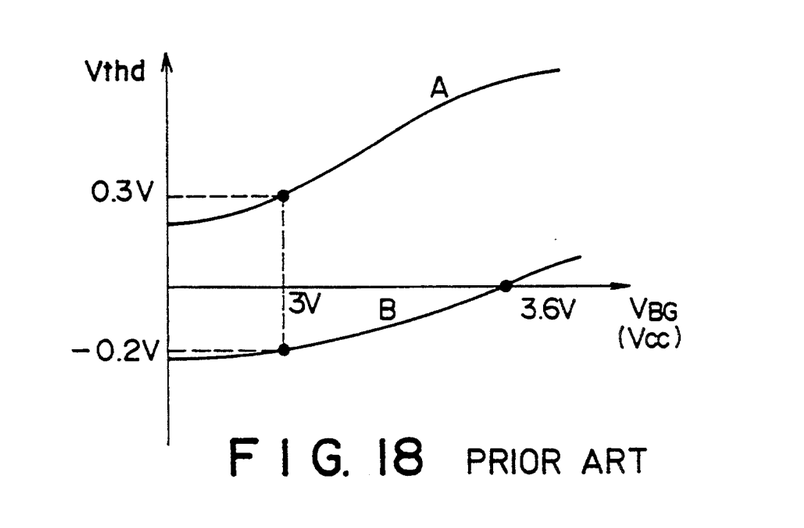
FIG. 18 is a graph for assistance in explaining the margin of the conventional D transistor.

In summary, in the conventional input and output circuit shown in FIG. 15, it is necessary to use the same element at the same bias conditions and further to decrease the inputted voltage Va as low as possible and increase the outputted voltage Vout as high as possible. FIG. 17 shows these conditions as a margin map of the conventional circuit, in which the worst cases are shown with the supply voltage Vcc taken on the abscissa and with the input voltage Va or the output voltage Vout taken on the ordinate. In other words, in the worst case, Va must be less than the breakdown voltage 3.6 V of the oxide film at Vcc=3.6 V. Therefore, the threshold voltage of the D transistor at the time when the back gate voltage Vcc is applied is Vthd (3.6 V)≧0 V. On the other hand, in the worst case, Vout must be higher than Von=2.7 V at Vcc=3 V. Therefore, the threshold voltage Vthd (3.0 V)≧0.3 V. FIG. 18 shows a margin of the threshold value of the D transistor, in which the back gate voltage $V_{BG}$ or VCC is taken on the abscissa and the threshold voltage Vthd is taken on the ordinate. In FIG. 18, the curve A indicates the characteristics of the Vthd required to secure the output voltage Vout at a predetermined value in dependence upon the back gate voltage $V_{BG}$, and the curve B indicates the characteristics of the Vthd required to secure the input voltage Va in dependence upon the back gate voltage $V_{BG}$. In FIG. 18, when Vcc=3 V. the allowable margin (difference) of the threshold voltage of the D transistor is about 0.5 V. This value of about 0.5 V is not satisfactory when the manufacturing dispersion and the temperature range at which the operation is guaranteed are taken into account. Further, it is impossible to widen the operation supply voltage range in the case of the conventional input and output circuit.

SUMMARY OF THE INVENTION

With these problems in mind, therefore, it is the object of the present invention to provide a semiconductor integrated circuit device including an input and output circuit and operative by two different supply voltages, by which it is possible to prevent a forward current from flowing from an input and output terminal to a PN junction of the output circuit when an external voltage higher than the supply voltages is applied to the input and output terminal.

To achieve the above-mentioned object, the semiconductor integrated circuit device according to the present invention comprises: a semiconductor substrate; an input and output terminal formed on said semiconductor substrate; an input and output circuit formed on said semiconductor substrate, connected to said input and output terminal, and having an output buffer of CMOS FETs, supply voltages being applied to the output buffer; a semiconductor integrated circuit formed on said semiconductor substrate and connected to said input and output circuit; and means for preventing forward junction current from flowing from said input and output terminal to the output buffer when an input voltage exceeding the supply voltages is applied to the output buffer.

When the input and output circuit is in the high impedance input status, the substrate potential is determined higher than the supply voltages. When a high voltage is applied to the input and output terminal, the high voltage is lowered before applied to the output buffer. Further, an output buffer is formed on a semiconductor substrate by a plurality of MOS transistors of different voltage levels, so that the external voltage can be inputted to the transistor of the voltage level corresponding to the external voltage. Therefore, it is possible to prevent the PN junction of the output buffer from being biased in the forward direction. Further, the input and output buffers are formed on a semiconductor substrate and further an external voltage is applied to the transistor of the supply voltage corresponding to the external voltage, so that the high voltage back gate voltage ($V_{BG}$) is not applied to the circuit, thus preventing a decease in the operation speed.

In the semiconductor integrated circuit device according to the present invention, it is possible to connect signals outputted from the integrated circuits of different supply voltages at high reliability. Further, it is possible to form a high speed input and output circuit, while preventing the circuit device from the speed deterioration due to back gate effect.

DETAILED DESCRIPTION OF THE PREFERRED EMBODIMENTS

Figure 1:
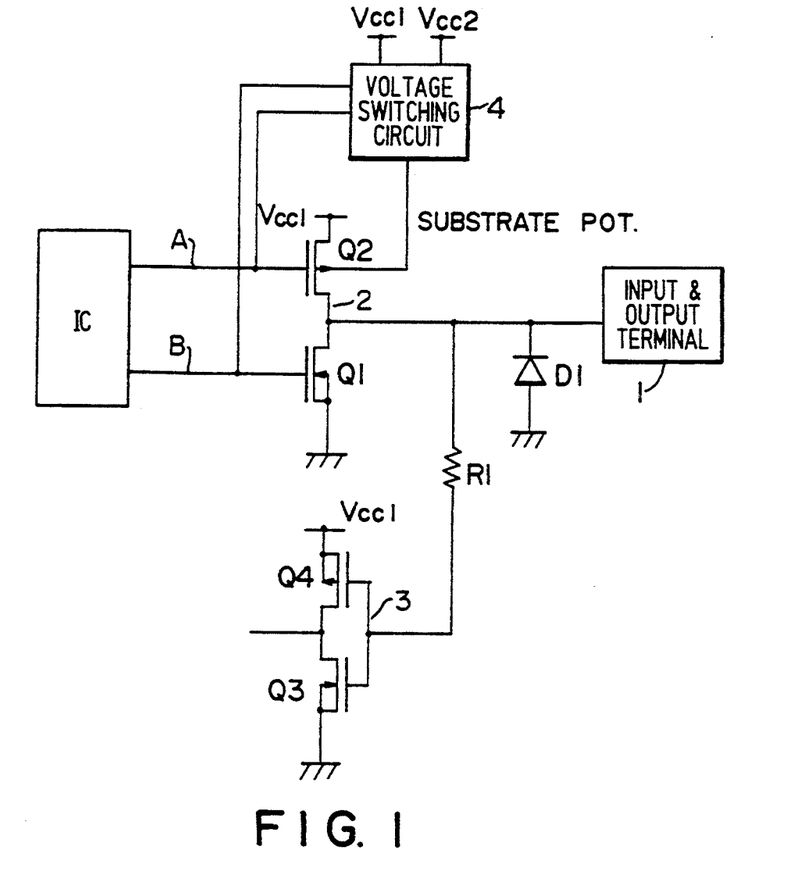
FIG. 1 is a circuit diagram showing a first embodiment of an input and output circuit of the semiconductor integrated circuit device according to the present invention.
Figure 2:
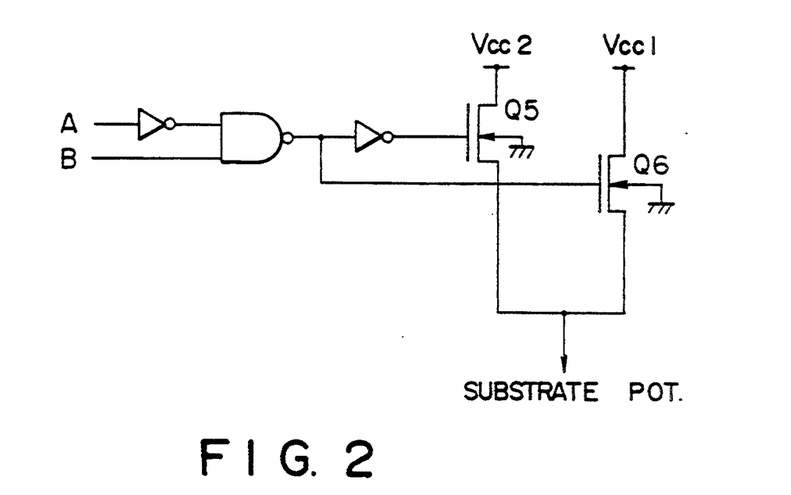
FIG. 2 is a circuit diagram showing a voltage switching circuit of the first embodiment of the input and output circuit device of the semiconductor integrated circuit device.

Embodiments of the present invention will be described hereinbelow with reference to the attached drawings. First, the first embodiment thereof will be described with reference to FIGS. 1 to 5. FIG. 1 shows an input and output circuit of the semiconductor integrated circuit device formed on a substrate, and FIG. 2 shows a voltage switching circuit (voltage supplying means) connected to the input and output circuit. In the same way as with the case of the conventional circuit, the input and output circuit of the integrated circuit device is composed of CMOS elements in the same way as the internal circuit elements. The input and output circuit is provided with an output buffer 2 and an input buffer 3, both connected to an input and output terminal 1. This input and output terminal 1 is referred to as a pad electrode on the semiconductor substrate. A number of pad electrodes are arranged on the periphery of the semiconductor substrate. Between the buffers 2, 3 and the input and output terminal 1, a protective circuit is connected to protect the circuit from an electrostatic discharge applied from the outside. This protective circuit is composed of a resistor R1 and a diode D1. The output buffer 2 is of CMOS structure composed of an NMOS transistor Q1 and a PMOS transistor Q2. The input buffer 3 is also of CMOS structure composed of an NMOS transistor Q3 and a PMOS transistor Q4. A signal A is applied to the gate of the PMOS transistor Q2 of the output buffer 2 and a signal B is applied to the gate of the NMOS transistor Q1 of the output buffer 2.

The output buffer 2 and the input buffer 3 both formed on a substrate are connected to an integrated circuit such as a gate array, for instance. The feature of this embodiment is to add a voltage switching circuit 4 for supplying a substage potential of the PMOS transistor Q2 to the input and output circuit. The voltage switching circuit 4 is controlled on the basis of the signals A and B which are output from semiconductor integrated circuit (SIC) applied to the output buffer 2. The signals A and B are connected to the voltage switching circuit 4. The switching circuit 4 supplies two supply voltages Vcc1 and Vcc2 as the substrate potential to the PMOS transistor Q2. Table 2 below lists the relationship between the voltage levels of the signals A and B and the substrate potential supplied by the voltage switching circuit 4. The signals A and B applied to the output buffer 2 create the input and output status according to the levels thereof as listed in Table 2. In more detail, when the signals A and B are both at an "L" level, the input and output status is an "H" output. When the signals A and B are both at an "H" level, the input and output status is an "L" output. When the signal A is at an "H" level and the signal B is at an "L" level, the input and output status is a high impedance input status. Further, the voltage switching circuit 4 supplies the supply voltage Vcc1 of the internal circuit at the "H" or "L" output, and a voltage Vcc2 higher than the Vcc1 at the high impedance input status.

TABLE 2

| A | B | SUBSTRATE POT. | INPUT/OUTPUT STATUS |
|---|---|---|---|
| L | L | Vcc1 | H OUTPUT |

TABLE 2-continued

| A | B | SUBSTRATE POT. | INPUT/OUTPUT STATUS |
|---|---|---|---|
| H | H | Vcc1 | L OUTPUT |
| H | L | Vcc2 | HIGH IMP. INPUT |

In the conventional circuit, when a voltage higher than the supply voltage is inputted from the outside, a problem arises only when the input and output circuit is in a high impedance input status. In this embodiment, however, since the voltage switching circuit 4 supplies the voltage Vcc2 (determined higher than an estimated input voltage applied from the outside) when the input and output circuit is in a high impedance input status, the PN junction formed at the drain of the PMOS transistor Q2 will not be biased in the forward direction, so that it is possible to operate the input and output circuit normally.

As the voltage switching circuit 4, any well-known switching circuits can be used, as far as the supply voltages appropriate for the predetermined input and output status of the input and output circuit can be supplied as the substrate potential. In this embodiment, however, a MOS transistor transmission gate as shown in FIG. 2 is used by way of example. The supply voltages Vcc1 and Vcc2 are applied to two NMOS transistors Q6 and Q5 (switching transistors), respectively so that either one of these voltages can be supplied as the substrate potential. The switching circuit is composed of NOT gates and an NAND gate. The signal A is connected to the NAND gate via the inverter and the signal B is directly connected to the NAND gate. The output of the NAND gate is connected to the gate of Q5 via the inverter and directly to the gate of Q6, respectively. Therefore, when the signal A is at "H" level and the signal B is at "L" level, Q5 is turned on and Q6 is turned off, so that the Vcc2 is supplied as the substrate potential. In other input and output status, Q5 is turned off and Q6 is turned on, so that the voltage Vcc1 (the same as the internal circuit) is supplied as the substrate potential. In the case of the semiconductor circuit device in which integrated circuits with the output voltages of 3 V and 5 V are mixed with each other, Vcc1 is determined as 3 V and Vcc2 is determined as 5 V, for instance.

Figure 3:
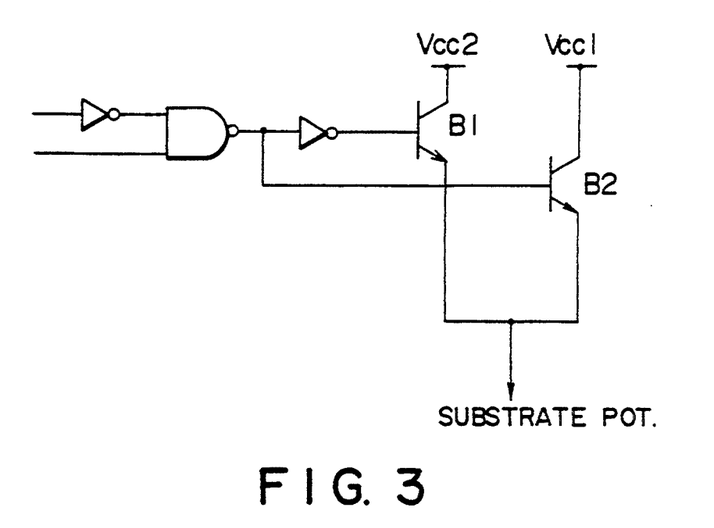
FIG. 3 is a circuit diagram showing another modification of the voltage switching circuit of the first embodiment of the input and output circuit device of the semiconductor integrated circuit device.
Figure 4:
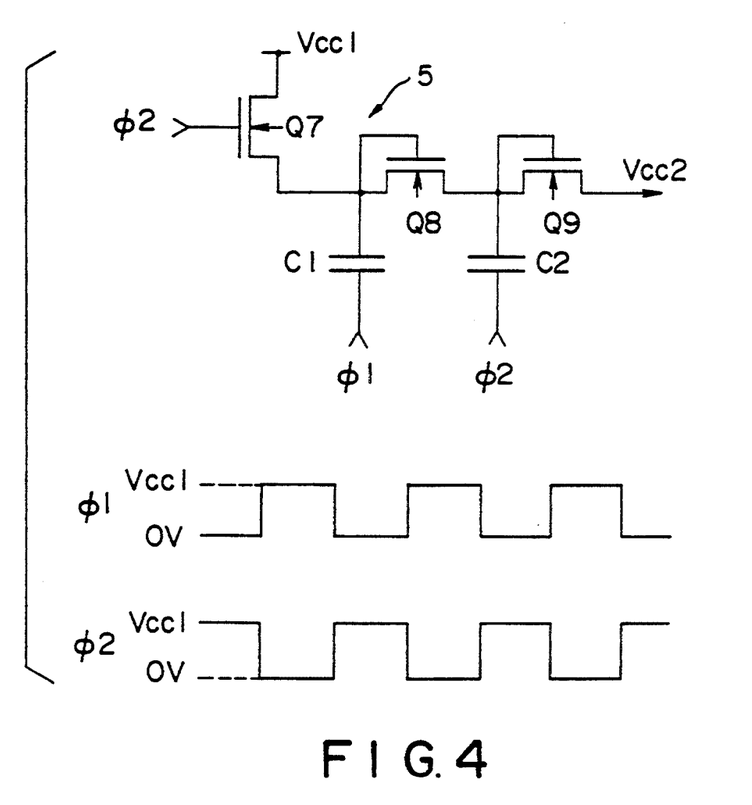
FIG. 4 is a circuit diagram showing a booster circuit of the first embodiment of the input and output circuit device of the semiconductor integrated circuit device.
Figure 5:
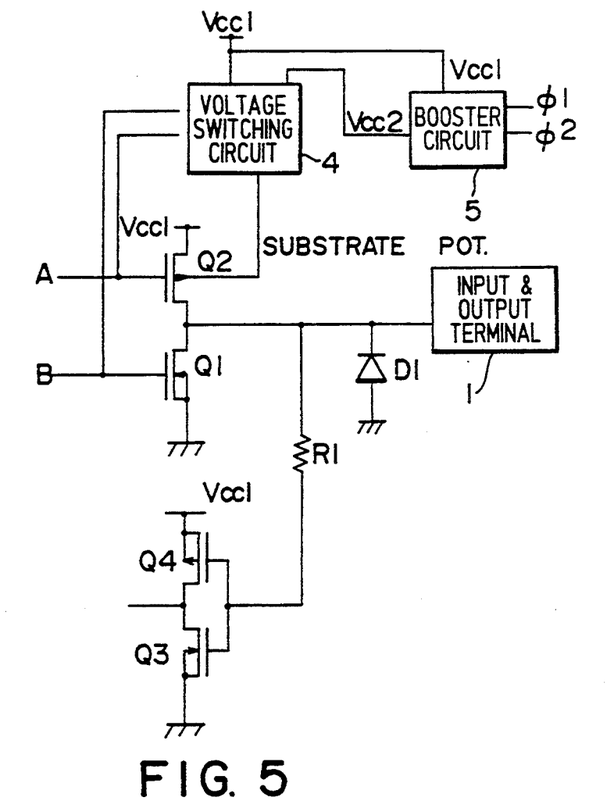
FIG. 5 is a circuit diagram showing the first embodiment of an input and output circuit of the semiconductor integrated circuit device according to the present invention, in which the booster circuit shown in FIG. 4 is connected to the voltage switching circuit shown in FIG. 1.

FIG. 3 shows another example of the voltage switching circuit 4, in which the MOS transistors shown in FIG. 2 are replaced with bipolar transistors of large current driving capability B1 and B2 as the elements for switching the supply voltages Vcc1 and Vcc2. Further, it is possible to supply the supply voltage Vcc2 higher than the internal voltage of the CMOS LSI from the outside through a voltage converter device. Since this voltage Vcc2 is used to provide a substrate potential of the PMOS transistor, no large power is necessary. Therefore, it is possible to generate this voltage Vcc2 by boosting the internal supply voltage Vcc1 within the integrated circuit. FIG. 4 shows an example of a boosting circuit 5, which is referred to as a charge pump circuit. In response to two mutually opposite phase pulse signals Φ1 and Φ2, a voltage twice higher than Vcc1 can be generated. In practice, however, the boosted voltage is slightly lower than 2 × Vcc1, because a voltage drops through the NMOS transistors Q8 and Q9, respectively. In usual, the pulse height (amplitude) is determined to be higher than 0 V and lower than Vcc1. This booster circuit 5 boosts the internal supply voltage Vcc1 by capacitors C1 and C2 to generate the voltage Vcc2. The boosted voltage Vcc2 is supplied to the voltage switching circuit 4. FIG. 5 shows the input and output circuit of the present invention, in which the voltage switching circuit 4 shown in FIG. 1 is connected to the booster circuit 5 shown in FIG. 4. The internal supply voltage Vcc1 is supplied to the booster circuit 5, and the boosted higher voltage Vcc2 is supplied to the voltage switching circuit 4 as one of the supply voltage.

Figure 6:
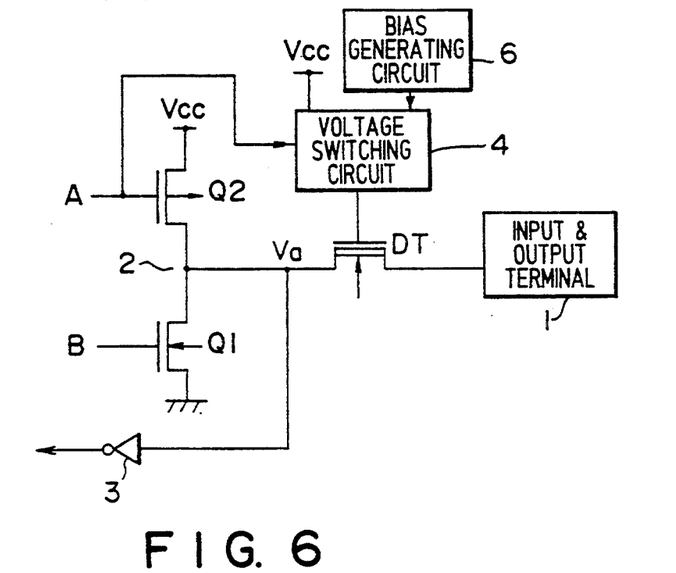
FIG. 6 is a circuit diagram showing a second embodiment of an input and output circuit of the semiconductor integrated circuit device according to the present invention.

The second embodiment of the present invention will be described hereinbelow with reference to FIGS. 6 to 10. In this embodiment, the present invention is applied to the semiconductor integrated circuit device provided with an interface circuit having a D transistor as the input and output circuit. FIG. 6 shows an input and output circuit of the semiconductor integrated circuit formed on a semiconductor substrate. In the same way as with the case of the conventional circuit, the input and output circuit of the integrated circuit device is composed of CMOS elements in the same way as the internal circuit elements. The input and output circuit is provided with an output buffer 2 and an input buffer 3, both connected to an input and output terminal 1. This input and output terminal 1 is referred to as a pad electrode on the semiconductor substrate. A number of pad electrodes are arranged on the periphery of the semiconductor substrate. Between the buffers 2, 3 and the input and output terminal 1, a protective circuit is connected to protect the circuit from an electrostatic discharge applied from the outside, as occasion demands. The output buffer 2 is of CMOS structure composed of an NMOS transistor Q1 and a PMOS transistor Q2 formed in an N well of the semiconductor substrate. The input buffer 3 is an inverter. A signal A is applied to the gate of the PMOS transistor Q2 of the output buffer 2 and a signal B is applied to the gate of the NMOS transistor Q1 of the output buffer 2. The output buffer 2 and the input buffer 3 are connected to an integrated circuit formed on a semiconductor substrate. The feature of this second embodiment is to connect a D transistor; that is, a depletion type NMOS transistor DT between the input and output terminal (pad) 1 and the input and output circuit.

In FIG. 6, the source of the D transistor DT is connected to the input and output terminal 1 and the drain thereof is connected to the input and output circuit, respectively. Further, the gate thereof is connected to a voltage switching circuit 4 to which a supply voltage Vcc and a bias generating circuit 6 are connected. Therefore, either one of the voltages is applied to the gate of the D transistor DT through the voltage switching circuit 4. This voltage switching circuit 4 is controlled in response to the signal A applied to the PMOS transistor Q2. In this embodiment, the D transistor DT effects two contradictory functions. One is not to transmit the externally applied 5V to the internal side as much as possible and further to suppress the internal Va as low as possible, when the high supply voltage of 5 V, for instance is inputted from the outside through the input and output terminal. The other is to transmit the internal voltage Vcc to the external side as much as possible, without dropping the voltage Vcc, to secure the signal amplitude of Vout, when the supply voltage Vcc is outputted.

To realize the above-mentioned contradictory operations, in this embodiment, a bias generating circuit 6 and the voltage switching circuit 4 are connected to the interface circuit, in order that the voltage applied to the gate of the D transistor is switched to the voltage Vcc or an intermediate voltage (output voltage of the bias generating circuit 6) according to the input and output status. As a result, it is possible to realize the two contradictory functions of the D transistor DT (which have so far raised a problem) under optimum bias conditions. That is, when the voltage Vcc is to be outputted, the gate of the D transistor DT is switched to Vcc as is conventional to transmit the internal supply voltage Vcc to the outside. Further, when the voltage 5 V is inputted from the external circuit, the gate of the D transistor DT is switched to the intermediate voltage so as not to transmit the external voltage 5 V to the internal circuits. In this case, it is impossible to set the intermediate voltage to a value lower than 1.4 V (5 V −3.6 V) for protection of the gate oxide film of the D transistor DT. The operation of the D transistor DT will be described hereinbelow on the assumption that the supply voltage (Vcc) is 3.3 V±0.3 V; the external signal amplitude is 5 V; and the bias circuit output voltage is 2 V, respectively.

Figure 7:
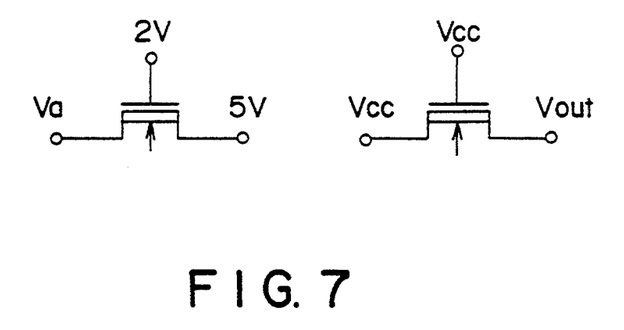
FIG. 7 is an illustration for assistance in explaining the bias status of the D transistor used in the second embodiment.
Figure 8:
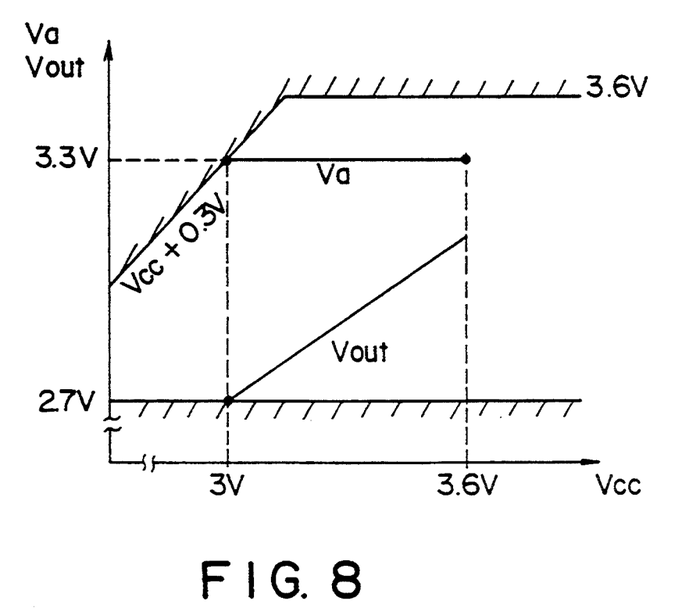
FIG. 8 is a margin map of the second embodiment of the input and output circuit.

FIG. 7 shows the bias status of the D transistor DT under these conditions, with reference to which the bias conditions of the D transistor DT will be explained. When 5 V is inputted from the external circuit, 5 V is applied to the source thereof via the input and output terminal (pad) 1, and 2 V (the intermediate voltage) of the bias generating circuit 6 is applied to the gate thereof. Therefore, the input voltage Va is 2 V−Vthd (Vcc). Here, the second term is the threshold voltage of the D transistor DT obtained when a back gate voltage Vcc is applied. On the other hand, when the Vcc is outputted, the source and the drain are reversed as is conventional, so that Vcc is applied to the source and the drain. Here, Vout is Vcc−Vthd (Vcc). In other words, it is possible to use the same element at two different bias conditions by realizing that Va is suppressed as low as possible and Vout is outputted as high as possible. FIG. 8 is a margin map indicating the above-mentioned conditions, in which the worst cases are shown with Vcc taken on the abscissa and with Va or Vout taken on the ordinate. FIG. 8 indicates that the worst (highest) Va is 3.3 V (the forward bias point at the PN junction of the PMOS transistor Q2 at Vcc=3 V). Therefore, Va must be lower than 3.3 V.

Figure 9:
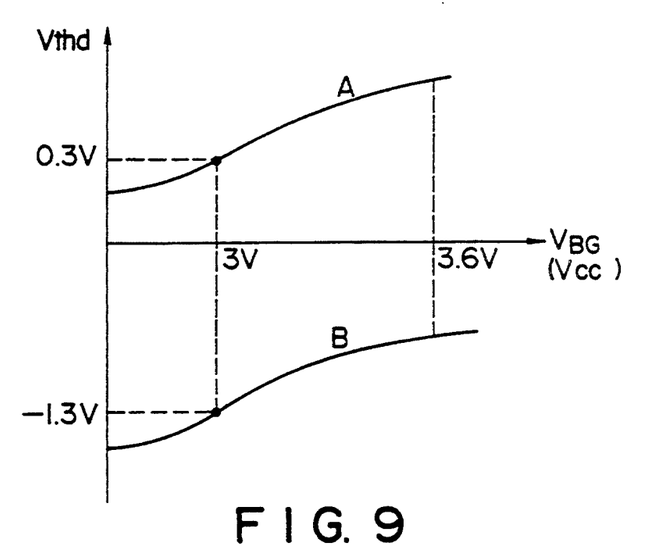
FIG. 9 is an illustration for assistance in explaining the bias status of the D transistor used in the second embodiment.

Accordingly, Vthd (3.0 V)−1.3 V. On the other hand, in the case of the worst (lowest) Vout, Von=2.7 V is necessary at Vcc=3 V. Therefore, Vthd (3.0 V)≦0.3 V. FIG. 9 shows the margin of the threshold voltage Vthd of the D transistor DT, in which the back gate voltage or Vcc is taken on the abscissa and the threshold voltage Vthd is taken on the ordinate. FIG. 9 indicates that the allowable dispersion of the threshold voltage Vthd of the D transistor DT is about 1.6 V at Vcc=3 V. This value is about three times as wide as that of the conventional value, and therefore sufficient when the dispersion during the manufacturing process and the guarantee within the operation temperature range are both taken into account. Further, it is possible to widen the operation supply voltage range between 2.7 V and 3.6 V in the above-mentioned method. Further, in FIG. 9, the curve A indicates the threshold voltage Vthd of the D transistor DT required to obtain 2.7 V or higher output voltage Vout, and the curve B indicates the threshold voltage Vthd required to obtain 3.6 V or lower input voltage Va.

Figure 10:
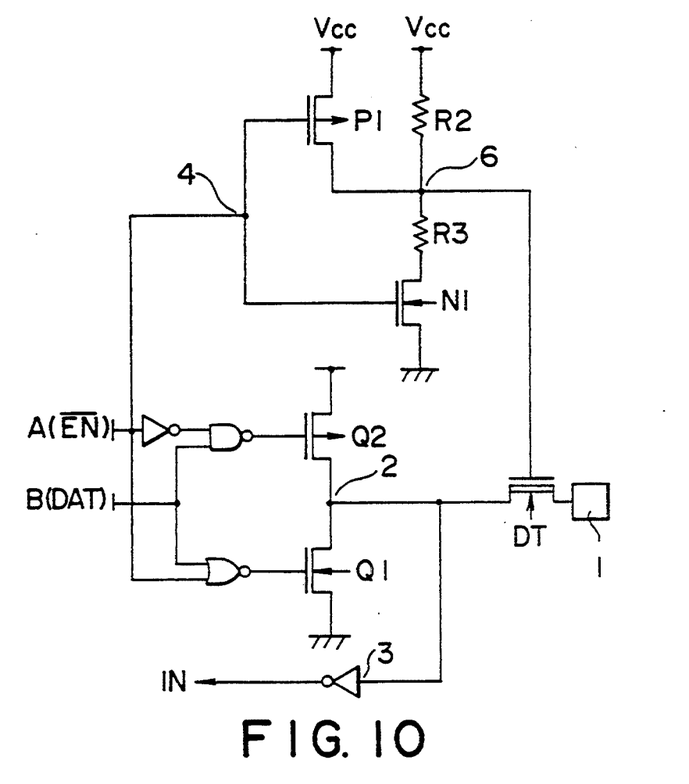
FIG. 10 is a circuit diagram showing examples of the bias generating circuit and the voltage switching circuit of the second embodiment of an input and output circuit of the semiconductor integrated circuit device according to the present invention.

FIG. 10 shows an example of the bias generating circuit 6 and the voltage switching circuit 4, respectively. The feature of this embodiment is to operate the voltage switching circuit 4 on the basis of the signals A and B applied to the output buffer 2. The signal A of an enable signal EN, for instance is applied to a NAND gate via an inverter and additionally to one input terminal of an NOR gate. The output of the NAND gate is connected to the gate of a PMOS transistor Q2. On the other hand, the signal B of a data signal DAT, for instance is applied to the other input terminal of the NAND gate and additionally to the other input terminal of the NOR gate. The output of the NOR gate is connected to the gate of the NMOS transistor Q1. The signal A is used as an operation signal of the voltage switching circuit 4; that is, applied to the gates of a PMOS transistor P1 and an NMOS transistor N1, respectively. The drain of the PMOS transistor P1 is connected to a supply voltage Vcc and the source thereof is connected to the gate of the D transistor DT. The drain of the NMOS transistor N1 is connected to the supply voltage Vcc via two resistors R2 and R3, and the source thereof is grounded (GND potential). The source of the PMOS transistor P1 and the gate of the D transistor DT are connected to an intermediate point between the two resistors R2 and R3, so that an intermediate voltage of about 2 V is applied to the gate of the D transistor DT.

In the circuit configuration as described above, in order to set the input and output circuit to the high impedance input status, the PMOS transistor Q2 and the NMOS transistor Q1 must be both turned off. Therefore, the output of the NAND gate is set to the "H" level and the output of the NOR gate is set to the "L" level. Accordingly, when 5 V is inputted from the external circuit through the input and output terminal (pad) 1, the enable signal EN (A) and the data signal DAT (B) are both set to the "H" level. Simultaneously, under these input conditions, the PMOS transistor P1 of the bias generating circuit 6 is turned off; the NMOS transistor N1 is turned on; and further the intermediate voltage of about 2 V (obtained by dividing the supply voltage Vcc by the resistors R2 and R3) is applied to the D transistor DT. Therefore, even if a different supply voltage of 5 V is applied to the pad 1, an input voltage Va (=2 V−Vthd) is transmitted to the inside of the semiconductor substrate.

On the other hand, when Vcc is outputted, since the PMOS transistor Q2 must be turned on and the NMOS transistor Q1 must be turned off, the enable signal EN is set to the "L" level and the data signal DAT is set to the "H" level, respectively. Therefore, the outputs of both the NAND gate and the NOR gate are set to the "L" level to set the push-pull output buffer 2 to the H level output status. Under these conditions, in response to the L level enable signal EN, the NMOS transistor N1 of the bias generating circuit 6 is turned off and the PMOS transistor P1 thereof is turned on, so that the supply voltage Vcc is applied to the gate of the D transistor DT. As described above, the H bias output is transmitted to the pad 1 through the D transistor DT. As described above, the gate of the D transistor DT is fixed to Vcc when Vcc is outputted and switched to the intermediate voltage of 2 V when 5 V is inputted. In the above-mentioned embodiment, the intermediate voltage is divided by the resistors of the bias generating circuit 6. The similar circuit can be realized by use of diodes, a transistor circuit including capacitors or diodes.

Figure 11:
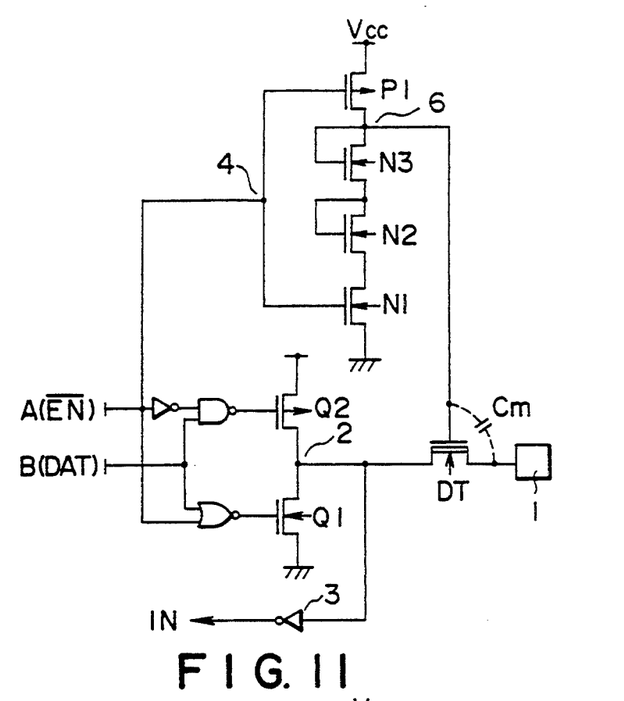
FIG. 11 is a circuit diagram showing other examples of the bias generating circuit and the voltage switching circuit of the second embodiment of an input and output circuit of the semiconductor integrated circuit device according to the present invention.

FIG. 11 shows another example of the bias generating circuit 6 and the voltage switching circuit 4, in which the input and output circuit is the same in configuration as in FIG. 10. The drain of the PMOS transistor P1 is connected to the supply voltage Vcc, and the source thereof is connected to the gate of the D transistor DT. The drain of the NMOS transistor N1 is connected to the source of the transistor P1 via two NMOS transistors N3 and N2, and the source thereof is connected to ground (GND potential). The gate and the drain of each of the NMOS transistors N2 and N3 are connected to each other, respectively. In the configuration as described above, when 5 V is inputted from the outside through the pad 1, the input and output circuit is set to the high impedance input status; that is, the enable signal EN (A) is set to the "H" level. Therefore, the outputs of the NAND gate and the NOR gate are fixed to the "H" level and the "L" level, respectively, so that the PMOS transistor Q2 and the NMOS transistor Q1 of the output buffer are both turned off. Under these conditions, since the enable signal EN (A) is connected to the gates of the PMOS transistor P1 and the NMOS transistor N1 of the bias generating circuit 6, respectively, P1 is turned off and N1 is turned on. Under these conditions, if 5 V is applied from the outside through the pad 1, the potential of the gate of the D transistor DT rises due to the presence of a mirror capacitance Cm.

However, when this potential rises up to a value corresponding to the threshold voltage (about 2 V due to the back gate effect) of the diode-connected two-stage NMOS transistors N2 and N3, since these NMOS transistors N1, N2 and N3 are all turned on, the potential is clamped at about 2 V. As a result of this, even if another supply voltage of 5 V is applied to the pad 1, an input voltage of Va =(2 V−Vthd) is transmitted to the internal circuits of the semiconductor substrate. On the other hand, when Vcc is outputted, the enable signal EN is set to the "L" level and the data signal DAT is set to the "H" level, so that the outputs of the NAND gate and the NOR gate are both at the "L" level, with the result that the push-pull output buffer 2 is at the H output status. At the same time, the NMOS transistor N1 of the bias generating circuit 6 is turned off and the PMOS transistor P1 thereof is turned on, so that the supply voltage Vcc is applied to the gate of the D transistor DT. As described above, the H output of the output buffer 2 is transmitted to the pad 1 via the full-biased D transistor DT. That is, the gate of the D transistor DT is fixed to Vcc at Vcc output, and switched to about 2 V (threshold voltage of two-stage NMOS transistors) at 5 V input. In the construction as described above, since either one of the transistor P1 or N1 of the bias generating circuit 6 is turned off, it is possible to prevent current from flowing in the stationary state, so that it is possible to reduce the current consumption as compared with the circuit as shown in FIG. 10. In the above-mentioned embodiment, although the diode-connected transistors are used as the bias generating circuit 6, it is of course possible to realize the same effect by use of only diodes.

Figure 12:
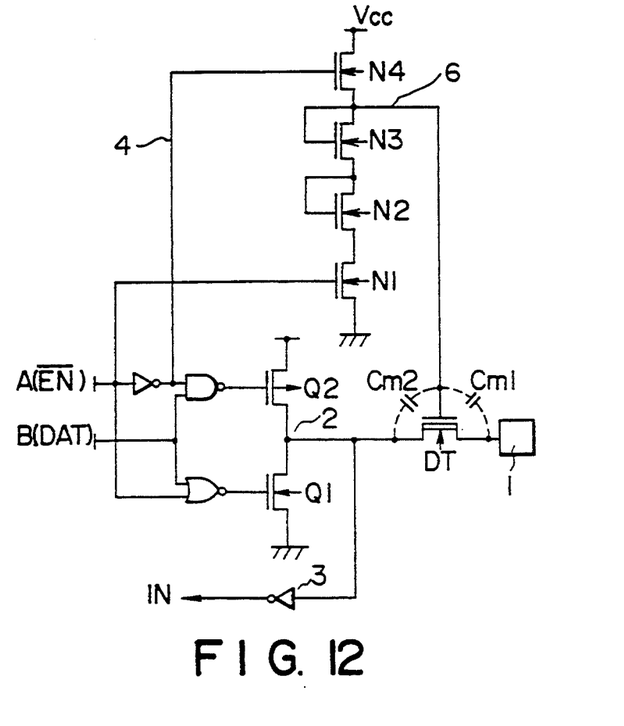
FIG. 12 is a circuit diagram showing still other examples of the bias generating circuit and the voltage switching circuit of the second embodiment of an input and output circuit of the semiconductor integrated circuit device according to the present invention.

With reference to FIG. 12, another example of the bias generating circuit 6 and the voltage switching circuit 4 will be described hereinbelow, in which the input and output circuit is the same in configuration as in FIG. 10. The drain of the NMOS transistor N4 is connected to the supply voltage Vcc, and the source thereof is connected to the gate of the D transistor DT. Further, three NMOS transistors N1, N2 and N3 are diode-connected to the N4. The gate and the drain of the transistor N2 or N3 are connected each other, respectively. In the configuration as described above, when 5 V is inputted from the outside through the pad 1, the input and output circuit is set to the high impedance input status, so that the enable signal EN (A) is set to the "H" level. Therefore, the outputs of the NAND gate and the NOR gate are fixed to the "H" level and the "L" level, respectively, so that the PMOS transistor Q2 and the NMOS transistor Q1 of the output buffer are both turned off. Under these conditions, since the enable signal EN (A) is connected to the gate of the NMOS transistor N1 of the bias generating circuit 6 and further the output of the inverter is connected to the gate of the NMOS transistor N1 respectively, N4 is turned off and N1 is turned on. Under these conditions, if 5 V is applied from the outside through the pad 1, the potential of the gate of the D transistor DT rises due to the presence of a mirror capacitance Cm. However, when this potential rises up to a value corresponding to the threshold voltage (about 2 V due to the back gate effect) of the diode-connected two-stage NMOS transistors N2 and N3, since these NMOS transistors N1, N2 and N3 are all turned on, the potential is clamped at about 2 V. As a result of this, even if another supply voltage of 5 V is applied to the pad 1, an input voltage of Va=(2 V−Vthd) is transmitted to the internal circuits of the semiconductor substrate. On the other hand, when Vcc is outputted, the enable signal EN is set to the "L" level and the data signal DAT is set to the "H" level, so that N1 of the bias generating circuit 6 is turned off and N4 is turned on. As a result of this, a potential (a drop due to the threshold value of N4 is subtracted from the supply voltage Vcc) is applied to the gate of the D transistor DT. Under these conditions, the outputs of the NAND gate and the NOR gate are both at the "L" level, with the result that the push-pull output buffer 2 is at the H output status. As a result, the potential of the gate of the D transistor DT rises up to about (2Vcc−Vthd) due to the mirror capacitance Cm2. As described above, the H output of the output buffer 2 is transmitted to the pad 1 under the condition that the D transistor DT is in the sufficiently low impedance status.

As described above, the gate of the D transistor DT is fixed to (2Vcc−Vthd) at Vcc output, and switched to about 2 V (the threshold voltage of two-stage NMOS transistors) at 5 V input. In the construction as described above, since either one of the transistor N4 or N1 of the bias generating circuit is turned off, it is possible to prevent current from flowing in the stationary state, so that it is possible to reduce the current consumption as compared with the circuit as shown in FIG. 10. Further, it is possible to keep the impedance of the D transistor DT at a sufficiently low resistance when Vcc is outputted. In the above-mentioned embodiment, although the diode-connected transistors are used as the bias generating circuit 6, it is of course possible to realize the same effect by use of only diodes.

Figure 13:
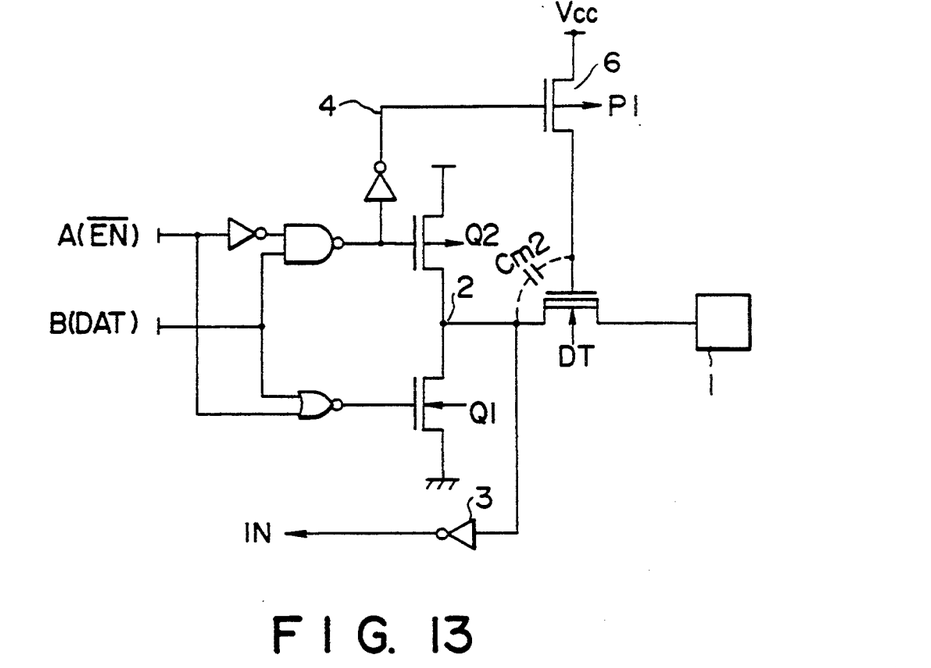
FIG. 13 is a circuit diagram showing further other examples of the bias generating and the voltage switching circuit of the second embodiment of an input and output circuit of the semiconductor integrated circuit device according to the present invention.

With reference to FIG. 13, another example of the bias generating circuit 6 and the voltage switching circuit 4 will be described hereinbelow, in which the input and output circuit is the same in configuration as in FIG. 10. The drain of the PMOS transistor P1 is connected to the supply voltage Vcc, and the source thereof is connected to the gate of the D transistor DT. In the configuration as described above, when 5 V is inputted from the outside through the pad 1, the input and output circuit is set to the high impedance input status; that is, the enable signal EN (A) is set to the "H" level. Therefore, the outputs of the NAND gate and the NOR gate are fixed to the "H" level and the "L" level, respectively, so that the PMOS transistor Q2 and the NMOS transistor Q1 of the output buffer 2 are both turned off. Under these conditions, since the gate of the PMOS transistor P1 of the bias generating circuit 6 is connected to the output of the NAND gate via the inverter, the PMOS transistor P1 connected to the gate of the D transistor DT is turned on to fix the potential to Vcc. Therefore, even if another supply voltage of 5 V is applied to the pad 1 from the outside, an input voltage of Va =(V−Vthd) is transmitted to the internal circuits of the semiconductor substrate.

In this case, the threshold voltage Vthd of the D transistor DT is so determined that Va will not exceed 3. 6 V. On the other hand, when Vcc is outputted, the enable signal EN is set to the "L" level and the data signal DAT is set to the "H" level, so that the outputs of the NAND gate and the NOR gate are both at the "L" level. Accordingly, the PMOS transistor P1 is turned off, so that the gate of the D transistor DT is in the high impedance status and the push-pull output buffer 2 is at the H output status. As a result, the potential of the gate of the D transistor DT rises up to about (Vcc+Vthd) due to the mirror capacitance Cm2. As described above, the H output of the output buffer 2 is transmitted to the pad 1 under the condition that the D transistor DT is in the sufficiently low impedance status.

As described above, the gate of the D transistor DT is fixed to (Vcc+Vthd) at Vcc output, and switched to the supply voltage Vcc at 5 V input. In the construction as described above, it is possible to prevent current from flowing in the stationary state, so that it is possible to reduce the current consumption as compared with the circuit as shown in FIG. 10. Further, it is possible to keep the impedance of the D transistor DT at a sufficiently low resistance when Vcc is outputted.

The present invention can be applied to various known semiconductors such as GaAs, without being limited to only the silicon semiconductor. In addition, it is possible to combine the respective embodiments with each other; that is, it is possible to use the voltage generating circuit of the second embodiment with the input and output buffer of the first embodiment, for instance.

As described above, in the semiconductor integrated circuit device according to the present invention, it is possible to connect signals outputted from the integrated circuits of different supply voltages at high reliability. Further, it is possible to form an high speed input and output circuit free from the speed deterioration due to back gate effect.

What is claimed is:

1. A semiconductor integrated circuit device, comprising:
   a semiconductor substrate;
   an input and output terminal formed on said semiconductor substrate;
   an input and output circuit formed on said semiconductor substrate, connected to said input and output terminal and comprising an output buffer of MOSFETs coupled to said input and output terminal, said output buffer being coupled to a supply voltage at a supply voltage node;
   a semiconductor integrated circuit formed on said semiconductor substrate and connected to said input and output circuit through said output buffer; and
   means for preventing forward junction current from flowing from said input and output terminal to the supply voltage node when an input voltage exceeding said supply voltage is applied to said input and output terminal, wherein said means for preventing comprises a voltage switching circuit for switching a voltage from said means for preventing applied to the semiconductor substrate of one of said MOSFETs within the output buffer from a first supply voltage to a second supply voltage or vice versa.

2. The circuit device of claim 1, wherein said voltage switching means comprises a first switching element connected tot he first supply voltage and a second switching element connected to the second supply voltage, either one of the first and second switching elements being selectively turned on.

3. The circuit device of claim 2, wherein said first and second switching elements are FETs.

4. The circuit device of claim 2, wherein said first and second switching elements are bipolar transistors of large current driving capability.

5. The circuit device of claim 1, which further comprises: a booster circuit for boosting the first supply voltage to the second supply voltage.

6. The circuit device of claim 5, wherein said voltage switching means comprises a first switching element connected to the first supply voltage and a second switching element connected to the second supply voltage, either one of the first and second switching elements being selectively turned on.

7. The circuit device of claim 6, wherein said first and second switching elements are FETs.

8. The circuit device of claim 6, wherein said first and second switching elements are bipolar transistors of large current driving capability.

9. A semiconductor integrated circuit device, comprising;
   a semiconductor substrate;
   an input and output terminal formed on said semiconductor substrate;
   an input and output circuit formed on said semiconductor substrate, connected to said input and output terminal and comprising an output buffer of MOSFETs coupled to said input and output terminal, said output buffer being coupled to a supply voltage at a supply voltage node;
   a semiconductor integrated circuit formed on said semiconductor substrate and connected to said input and output circuit through said output buffer, wherein said semiconductor integrated circuit provides a control signal to said MOSFETs of said output buffer and said output buffer is placed in a high impedance state in response to said control signal; and
   means, responsive to said control signal, for preventing forward junction current from flowing from said input and output terminal to the supply voltage node when an input voltage exceeding said supply voltage is applied to said input and output terminal, wherein said means for preventing comprises a voltage switching circuit for switching a voltage from said means for preventing applied to the semiconductor substrate of one of said MOSFETs within the output buffer from a first supply voltage to a second supply voltage or vice versa.

10. The circuit device of claim 9, wherein said voltage switching means comprises a first switching element connected to the first supply voltage and a second switching element connected to the second supply voltage, either one of the first and second switching elements being selectively turned on.

11. The circuit device of claim 10, wherein said first and second switching elements are FETs.

12. The circuit device of claim 10, wherein said first and second switching elements are bipolar transistors of large current driving capability.

13. The circuit device of claim 9, which further comprises: a booster circuit for boosting the first supply voltage to the second supply voltage.

14. The circuit device of claim 13, wherein said voltage switching means comprises a first switching element connected to the first supply voltage and a second switching element connected to the second supply voltage, either one of the first and second switching elements being selectively turned on.

15. The circuit device of claim 14, wherein said first and second switching elements are FETs.

16. The circuit device of claim 14, wherein said first and second switching elements are bipolar transistors of large current driving capability.

17. A semiconductor integrated circuit device, comprising:
a semiconductor substrate;
an input and output terminal formed on said semiconductor substrate;
an input and output circuit formed on said semiconductor substrate, connected to said input and output terminal and comprising an output buffer of MOSFETs coupled to said input and output terminal, said output buffer being coupled to a supply voltage at a supply voltage node;
a semiconductor integrated circuit formed on said semiconductor substrate and connected to said input and output circuit through said output buffer, wherein said semiconductor integrated circuit provides a first and second signal to said MOSFETs of said output buffer and said output buffer is placed in a high impedance state in response to said first and second signal; and
means for preventing forward junction current from flowing from said input and output terminal to the supply voltage node when an input voltage exceeding said supply voltage is applied to said input and output terminal, wherein said means for preventing comprises a voltage switching circuit for switching a voltage from said means for preventing applied to the semiconductor substrate of one of said MOSFETs within the output buffer from a first supply voltage to a second supply voltage or vice versa, said means for preventing switching in response to state of said first and second signals.

18. The circuit device of claim 17, wherein said voltage switching means comprises a first switching element connected to the first supply voltage and a second switching element connected to the second supply voltage, either one of the first and second switching elements being selectively turned on.

19. The circuit device of claim 18, wherein said first and second switching elements are FETs.

20. The circuit device of claim 18, wherein said first and second switching elements are bipolar transistors of large current driving capability.

21. The circuit device of claim 17, which further comprises: a booster circuit for boosting the first supply voltage to the second supply voltage.

22. The circuit device of claim 21, wherein said voltage switching means comprises a first switching element connected to the first supply voltage and a second switching element connected to the second supply voltage, either one of the first and second switching elements being selectively turned on.

23. The circuit device of claim 22, wherein said first and second switching elements are FETs.

24. The circuit device of claim 22, wherein said first and second switching elements are bipolar transistors of large current driving capability.

25. A semiconductor integrated circuit device, comprising:
a semiconductor substrate;
an input and output terminal formed on said semiconductor substrate;
an input and output circuit formed on said semiconductor substrate, connected to said input and output terminal and comprising an output buffer of MOSFETs coupled to said input and output terminal, said output buffer being coupled to a supply voltage at a supply voltage node;
a semiconductor integrated circuit formed on said semiconductor substrate and connected to said input and output circuit through said output buffer; and
means for preventing forward junction current from flowing from said input and output terminal to the supply voltage node when an input voltage exceeding said supply voltage is applied to said input and output terminal, wherein said means for preventing comprises:
a depletion type FET connected between said input and output terminal and said input and output circuit; and
gate voltage switching means for switching a gate voltage applied to said depletion type FET from a first voltage to a second voltage or vice versa.

26. The circuit device of claim 25, wherein said gate voltage switching means comprises:
a first switching means which turns on in response to a control signal to output a divided voltage obtained by dividing the supply voltage with a voltage divider; and
a second switching means which turns on in response to the control signal to output an undivided supply voltage.

27. The circuit device of claim 25, wherein said gate voltage switching means switches the gate voltage of said FET according to an input voltage applied to said input and output terminal.

28. The circuit device of claim 25, wherein an output voltage of said output buffer is coupled to the gate of said FET through capacitance coupling, and wherein said gate voltage means switches from a first status in which the FET gate voltage is fixed to a value obtained by adding the output voltage of the output buffer to a threshold voltage of said FET to a second status in which the FET gate voltage is substantially equal to the supply voltage.

29. The circuit device of claim 25, wherein an external voltage applied to said input and output terminal is coupled to the gate of said FET through capacitance coupling, and wherein said gate voltage means switches from a first status in which the FET gate voltage is fixed to a value obtained by subtracting a threshold voltage of said FET from an output voltage of said gate voltage switching means and a second status in which the FET gate voltage is substantially equal to the supply voltage.

30. A semiconductor integrated circuit device, comprising:
a semiconductor substrate;
an input and output terminal formed on said semiconductor substrate;
an input and output circuit formed on said semiconductor substrate, connected to said input and output terminal and comprising an output buffer of MOSFETs coupled to said input and output terminal, said output buffer being coupled to a supply voltage at a supply voltage node;
a semiconductor integrated circuit formed on said semiconductor substrate and connected to said input and output circuit through said output buffer, wherein said semiconductor integrated circuit provides a control signal to said MOSFETs of said output buffer and said output buffer is placed in a high impedance state in response to said control signal; and
means, responsive to said control signal, for preventing forward junction current from flowing from said input and output terminal to the supply voltage node when an input voltage exceeding said supply voltage is applied to said input and output terminal, wherein said means for preventing comprises:
a depletion type FET connected between said input and output terminal and said input and output circuit; and
gate voltage switching means for switching a gate voltage applied to said depletion type FET from a first voltage to a second voltage or vice versa.

31. The circuit device of claim 30, wherein said gate voltage switching means comprises:
a first switching means which turns on in response to a control signal to output a divided voltage obtained by dividing the supply-voltage with a voltage divider; and
a second switching means which turns on-in response to the control signal to output an undivided supply voltage.

32. The circuit device of claim 30, wherein said gate voltage switching means switches the gate voltage of said FET according to an input voltage applied to said input and output terminal.

33. The circuit device of claim 30; wherein an output voltage of said output buffer is coupled to the gate of said FET through capacitance coupling, and wherein said gate voltage means switches from a first status in which the FET gate voltage is fixed to a value obtained by adding the output voltage of the output buffer to a threshold voltage of said FET to a second status in which the FET gate voltage is substantially equal to the supply voltage.

34. A semiconductor integrated circuit device, comprising:
a semiconductor substrate;
an input and output terminal formed on said semiconductor substrate;
an input and output circuit formed on said semiconductor substrate, connected to said input and output terminal and comprising an output buffer of MOSFETs coupled to said input and output terminal, said output buffer being coupled to a supply voltage at a supply voltage node;
a semiconductor integrated circuit formed on said semiconductor substrate and connected to said input and output circuit through said output buffer, wherein said semiconductor integrated circuit provides a first and second signal to said CMOSFETs of said output buffer and said output buffer is placed in a high impedance state in response to said first and second signal; and
means for preventing forward junction current from flowing from said input and output terminal to the supply voltage node when an input voltage exceeding said supply voltage is applied to said input and output terminal, wherein said means for preventing comprises:
a depletion type FET connected between said input and output terminal and said input and output circuit; and
gate voltage switching means for switching a gate voltage applied to said depletion type FET from a first voltage to a second voltage or vice versa, said means for preventing switching in response to states of said first and second signals.

35. The circuit device of claim 34, wherein said gate voltage switching means comprises:
a first switching means which turns on in response to a control signal to output a divided voltage obtained by dividing the supply voltage with a voltage divider; and
a second switching means which turns on in response to the control signal to output an undivided supply voltage.

36. The circuit device of claim 34, wherein said gate voltage switching means switches the gate voltage of said FET according to an input voltage applied to said input and output terminal.

37. The circuit device of claim 34, wherein an output voltage of said output buffer is coupled to the gate of said FET through capacitance coupling, and wherein said gate voltage means switches from a first status in which the FET gate voltage is fixed to a value obtained by adding the output voltage of the output buffer to a threshold voltage of said FET to a second status in which the FET gate voltage is substantially equal to the supply voltage.

* * * * *